Oct. 11, 1966 L. E. FEATHER 3,278,455

ELECTRICALLY CONDUCTIVE RESIN COMPOSITIONS AND
ARTICLES COATED THEREWITH

Filed Jan. 30, 1962

WITNESSES

Edwin E. Bassler

C. L. Menzemer

INVENTOR
Landis E. Feather
BY
H. L. Towle
ATTORNEY

United States Patent Office 3,278,455
Patented Oct. 11, 1966

3,278,455

ELECTRICALLY CONDUCTIVE RESIN COMPOSITIONS AND ARTICLES COATED THEREWITH

Landis E. Feather, Hickory Township, Mercer County, Pa., assignor to Westinghouse Electric Corporation, East Pittsburgh, Pa., a corporation of Pennsylvania Filed Jan. 30, 1962, Ser. No. 169,831
14 Claims. (Cl. 252—512)

This invention relates to an electrically conductive metal-filled epoxy resin composition, and to a method for applying conductive coatings onto articles. The invention also relates to articles coated with the conductive composition.

More particularly, this invention relates to conductive coating compositions employing conductive particles together with epoxy resins catalyzed with an excess of a primary amine curing agent, to articles, as for example transformer static plates, coated with such compositions and to a method of applying the conductive coatings to articles.

The general concept of electrically conductive coatings is acknowledged as known in the arts. Typically, the compositions contain a resinous binding medium with finely divided electrically conductive particles dispersed in the medium. The resinous binding medium or coating material, without added fillers, is an electrical insulator. It will be apparent that because of the insulating properties of the binding medium, a high concentration of the conductive particles and extensive contact between particles is necessary to provide a satisfactory order of electrical conductivity. Moreover, some order of contact continuity between particles throughout the conductive area or volume will be necessary.

Coatings with a low order of electrical conductivity, generally referred to as resistive coatings, may be made with limited or small concentrations of conductive particles in the resinous composition or they may be made by employing particles or fillers with low conductivity, as for example, carbon black. Coatings with higher orders of conductivity are generally referred to as electrically conductive coatings to distinguish them from the described resistive coatings. Electrically conductive coatings employ a high concentration of finely divided metallic particles in the composition. Where a relatively high order of conductivity is desired, it is apparent that it will be necessary for the metallic particles themselves to have a high order of conductivity. For that reason, silver is extensively employed in compositions for electrically conductive coatings. However, the high cost of silver prohibits the widespread use of this particular metal in conductive coating compositions.

In addition to its high electrical conductivity, other properties of silver make it suitable as a filler in compositions for electrically conductive coatings. Because of their large exposed surface area, metals in finely divided form are very active and are susceptible to oxidation by the atmosphere. Finely divided silver is not easily oxidized by the atmosphere and therefore has exposed surfaces which remain conductive. Other metals, for example, copper and copper alloys, have satisfactory electrical conductivity. In finely divided form, however, a non-conducting oxide film, or partial film, quickly forms on the copper or copper alloy particles. When ohmmeter probes are inserted into a container of copper powder which has been exposed to the atmosphere, for example, the meter shows infinite resistance. Similarly, a mixture of a liquid resin and copper powder has an infinite resistance, as indicated by an ohmmeter. In order to make a copper or copper alloy-filled compound with a relatively high order of conductivity, removal or modification of the non-conducting oxide coating is necessary.

Accordingly, it is the general object of this invention to provide electrically conductive compounds which incorporate particulated or finely divided oxide coated copper and copper alloys as fillers in epoxy resin binder mediums.

It is a more particular object of this invention to provide electrically conductive compounds comprised of finely divided oxide coated copper or copper alloys, epoxy resin and an excess of a primary amine curing agent.

Another object of the invention is to provide a method for preparing electrically conductive coatings employing oxide coated copper or copper alloy particles.

A further object of this invention is to provide a transformer static plate coated with an electrically conductive coating which retains its conductivity after prolonged exposure to transformer oil.

Briefly, the present invention accomplishes the foregoing objects by employing an excess of a primary amine curing agent in a mixture of a fluid epoxy resin binding medium and a finely divided or particulated oxide coated copper or copper alloy filler. Primary amine curing agents are frequently employed to accelerate the polymerization of epoxy resins. An excess of the curing agent either reduces or complexes the oxide normally associated with finely divided copper or copper alloy powders exposed to the atmosphere.

Removal of the oxide coating exposes the conductive surfaces of the particles so that the particles which contact each other effectively form a continuous conductive path in the applied and cured coating. Surprisingly, the mixture may be applied to articles and cured to form a solid, adherent electrically conductive coating. When the coating is applied to transformer static plates and exposed to transformer oil, the coating of this invention retains a level of conductivity as high as that retained by a silver filled epoxy coating exposed to the same environment.

Further objects and advantages of the invention will become apparent as the following description proceeds and features of novelty which characterize the invention will be pointed out in particularity in the claims annexed to and forming a part of this specification.

For a better understanding of the invention reference may be had to the accompanying drawing, in which.

Figure 1:
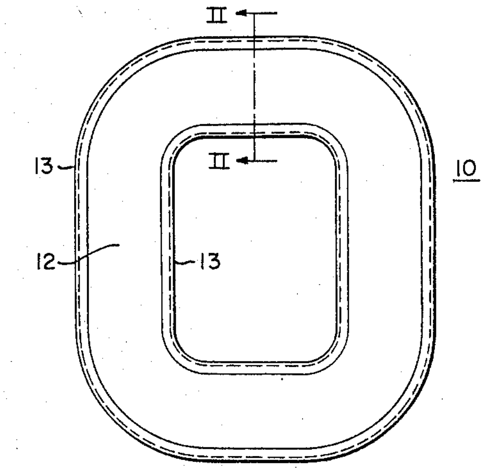
FIGURE 1 illustrates the front view of a transformer static plate.

As mentioned briefly hereinabove, copper and copper alloy powders are susceptible to surface oxidation when exposed to the atmosphere. The oxide coating on such powders has a high electrical resistance. It is difficult to keep such powders from oxidizing to a degree sufficient to significantly increase the resistance of the powder particle surface. The high resistance coating interferes with the desired continuity of the conductive path through the powder particles which contact each other, when the powder is employed as a filler in resinous conductive compounds. I have discovered a simple but effective solution to the foregoing problem.

Epoxy resins, frequently referred to as glycidyl polyethers or polymeric epoxides, have properties which make them suitable for use as coatings, bonding agents, binders, magnet wire insulation and the like. Glycidyl polyethers are employed as a binding medium for the electrically conductive coating compositions of this invention.

The epoxy resins, employed in this invention, may be either a liquid or a solid dissolved in organic solvents, as is well known in the art. The coating composition should be sufficiently fluid to permit application onto articles by spraying, brushing, flowing and the like. After application as a coating, the epoxy resin must be cured or polymerized to provide a tenaciously adherent, hardened resinous composition. Curing or polymerization converts the group of discrete epoxy resin molecules into larger macromolecules bonded together in three dimensions.

Curing agents are added to promote the polymerization reaction. Many chemical compounds are capable of curing epoxy resins. Included among them are aliphatic primary amine curing agents, as for example, dimethylamino propyl amine, diethylene triamine and triethylene tetramine. Selected amounts of the curing agents are added to the fluid epoxy resins to accelerate the polymerization reaction. I have discovered that if an excess of an aliphatic primary amine curing agent having one or more primary amino groups is employed in a composition containing an epoxy resin and oxide coated copper, copper alloy particles or mixtures thereof, the resulting cured composition has conductive properties approaching compositions which employ silver particles as a filler.

Apparently the excess amount of a primary amine either reduces or complexes the oxide coating and exposes the conductive metallic surfaces. I have also found that tertiary amines, such as benzyl dimethyl amine, will increase the conductivity to a much lower degree than the primary amine curing agents. The conductivity obtained with diethylene triamine is several thousand times as good as that obtained using benzyl dimethyl amine. Diethylene triamine has two primary amine groups and a secondary amine group while the benzyl dimethyl amine has a single tertiary amine grouping.

While I do not wish to be held to any particular theory, it may be that the active hydrogens in the primary and perhaps in the secondary amine groups of diethylene triamine, for example, are necessary for reaction with the oxide coating of the powder. A tertiary amine, such as benzyl dimethyl amine, would be essentially ineffective because of the lack of active hydrogens.

As specific examples, the following electrically conductive compositions may be prepared in accordance with this invention. It should be noted that Epon 820 and Epon 828, referred to hereinbelow, are proprietary commercial reactive epoxy resins that are condensation products of epichlorohydrin and bisphenol A (para,para'-isopropylidenediphenol), sold by Shell Chemical Corporation. Both of these resins are liquid and both have epoxide equivalents and molecular weights of 175 to 210 and 350–400, respectively. Many other reactive epoxy or glycidyl polyether resins are known in the art and may be employed in this invention. The preparation and use of such resins is disclosed, for example, in the Greenlee U.S. Patent No. 2,585,115.

*Example I*

| Material: | Parts by weight |
|---|---|
| Powdered copper, approximately 325 mesh | 65 |
| Epoxy resin (Shell Epon 828) | 35 |
| Diethylene triamine | 8 |

*Example II*

| Material: | Parts by weight |
|---|---|
| 70:30 brass powder, approximately 325 mesh | 80 |
| Epoxy resin (Shell Epon 820) | 20 |
| Diethylene triamine | 5 |

In the foregoing examples, the metallic powder and epoxy resin are stirred or milled together until the metallic powder is uniformly dispersed throughout the resin. The curing agent is then added and the mixture is again stirred. For easy brushing the mixture may be thinned with organic solvents such as acetone or toluol, for example. The composition is then applied to the article to be coated and the coating is cured.

Triethylene tetramine may be substituted for the diethylene triamine with equivalent results in conductivity. Diethylamino propyl amine may also be substituted for the diethylene triamine although the conductivity will not be as high as that attained when diethylene triamine is employed as the curing agent. Mixtures of the foregoing curing agents may also be employed.

In order to establish the effect of the polyamine concentration on the conductivity of cured compositions prepared according to this invention, the tests outlined hereinbelow were conducted. The compositions employed in the tests were identical to that outlined in Example II except for the amine curing agent concentration which was varied as described. In these tests, the resistance measurements were made using an ordinary ohmmeter. Rectangular copper foil electrodes two inches long were cemented to a flat insulating surface with the two inch long edges parallel and an inch apart. A coating of the compound under test was applied on the insulating surface and about a quarter of an inch over the edges of the foil electrodes. Ohmmeter measurements were made from copper foil to copper foil through the conducting compound.

Using diethylene triamine, minimum resistance occurs at about 20 to 25 phr. (parts per hudred of resin, by weight). Above this concentration of amine, the physical properties of the cured resin drop sharply, and below this concentration, the resistance rises undesirably. The resistance using 8 phr. of diethylene triamine is in excess of several megohms, dropping to a few thousand ohms at 15 phr., and to less than an ohm in the 20 to 25 phr. range. At 30 phr. of diethylene triamine a noticeably weaker cured material results. Similarly, the resistance goes up to several ohms at 30 phr.

Normally, 6 to 10 phr. of diethylene triamine are used to cure the Epon 820, Epon 828 and like epoxy resins. Even more particularly, 8 phr. of diethylene triamine is used to attain optimum physical and electrical properties for the cured resin. From the foregoing tests, I have observed that an increase in conductivity becomes noticeable at about 12 to 15 phr. of diethylene triamine. The maximum conductivity occurs at about 20 to 25 phr. It is apparent, therefore, that with the system described and with other systems prepared according to my invention, about a 50% excess, by weight, of amine produces a definite improvement in conductivity with the maximum conductivity occurring at about a 200% by weight excess of amine.

Referring now to FIG. 1, there is illustrated a transformer static plate 10 suitable for use in oil-filled high voltage transformers, as, for example, in the transformer structure disclosed in the Moore et al. U.S. Patent No. 2,993,183, assigned to the assignee of this invention. Static plates are employed to protect the coils of a transformer from breakdown due to surge voltages. A static plate has the general shape of the coil it is designed to protect and is mounted contiguous to the coil in the transformer structure. As is well known in the art, the static plate must be comprised of a conductivie material.

Figure 2:
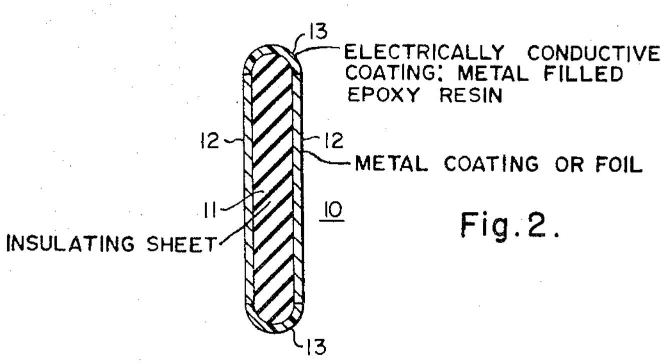
FIG. 2 illustrates a section of the transformer static plate of FIG. 1 taken along line X—X.

As illustrated more clearly in FIG. 2, the static plate 10 comprises an insulating core member 11 which may be constructed from any material such as pressboard, kraftboard or other electrical insulating material. A highly conductive material 12, as for example copper foil, a sprayed metallic film of copper or aluminum is employed to cover both faces of the core member. The edges of the static plate will be subjected to a concentration of electrical stresses. To keep the stresses below corona level, the resinous conductive material 13, in accordance with this invention, is applied to the inside and outside edges of the core member 11 by spraying, brushing or the like. The resinous conductive composition is cured to a solid, infusible state to form a unified composite structure. It will be understood that while the coating 13 has a relatively high order of conductivity for a resinous coating, its resistance is significantly higher than that of solid metallic conductors such as the film 12. This higher resistance at the edges reduces the concentration of electrical stress to a level below that at which corona may start.

Static plates which employ the resinous conductive composition disclosed and claimed herein exhibit an excellent retention of conductivity when exposed to the oil environments of transformers. The following test was conducted in order to compare the conductivity retention of this invention with the conductivity retention of commercially available silver filled conductive compositions. A piece of one-eighth inch thick pressboard was coated on one side by metal spraying with aluminum. Opposite edges of a 4 by 6 inch piece of this material were sanded to a roughly semi-circular contour similar to the edges of transformer static plates. Strips of copper foil one half inch by five inches were cemented to the bare sides parallel to and one half inch from the rounded edges.

One edge of the pressboard was coated with a brush coat of a silver pigmented epoxy compound, and the other edge with a mixture of 80 parts of the 70–30 brass powder of Example II, 20 parts of epoxy resin (Epon 820) and five parts of diethylene triamine, thinned with acetone to brushing consistency. After curing at room temperature, the coatings were sanded with emery cloth to smooth out most irregularities. The ohmeter resistances between the aluminum coating and the copper foil electrodes were measured and found to be 0.2 ohm through the silver coating and 0.7 ohm through the brass coating. The pressboard piece was immersed in transformer oil and aged at 100° C. for one year. After this aging period, the resistance of the brass coating was 1.0 ohm. The silver coating had a resistance of 1.4 ohms.

It should be understood that the terms conductive and resistive are relative and at best only reflect qualitative distinctions. The resistivity of the compositions of this invention is of a higher order than solid metallic conductors fabricated from copper, for example. Nonetheless, the resistivity of the compositions of this invention significantly lower than that of resistive compounds prepared, for example, with carbon black as a filler. The resistivity of the compositions may be controlled by varying the amount of oxide coated copper or copper alloy powder in the composition.

The oxide coated powder should be in the range of from about 50% to about 85% of the total weight of epoxy resin, curing agent and powder. A range of 65% to 80% is preferred as offering optimum electrical and physical properties. Less than 50% of powder will result in higher resistivities and may be useful within limits for applications not requiring the high degree of conductivity normally attained. When the powder exceeds 85% by weight, the small amount of epoxy resin in the composition results in poor adhesion after cure as well as poor wetting and dispersion of the powder particles in preparing the fluid composition.

It should also be understood that the oxide coated copper or copper alloy powders are not necessarily completely coated with the non-conductive oxide film. The invention includes particles which are oxidized to any degree which would interfere with contact conductivity between particles. It is apparent that the excess curing agent would be beneficial where the powder particles are slightly or partially oxidized. Nor is the invention limited to any particular shape or form of particle. Copper, brass or other copper alloys, alone or in combination, which are subject to oxidation are within the scope of this invention.

For applications not requiring the highest degree of conductivity, a proportion, up to about 25% by weight of finely divided inert fillers may be employed in the composition to obtain other desirable properties. Examples of such inert fillers are magnesium silicate, titanium dioxide, silica, bentonite and the like. Coloring pigments such as chrome yellow and toluidine red, for example, may be added in small quantities as inert filler. The finely divided inert fillers may be employed singly or in combination. It is to be understood that the conductive powder or particulated fillers of the invention are not considered to be inert fillers and should be distinguished therefrom.

While there have been shown and described what are at present considered to be the preferred embodiments of the invention, modifications thereto will readily occur to those skilled in the art. It is not desired, therefore, that the invention be limited to the specific arrangements shown and described and it is intended to cover in the appended claims all such modifications as fall within the true spirit and scope of the invention.

I claim:

1. A composition adapted to provide an electrically conductive resinous solid comprising an intimate admixture of an epoxy resin, up to about 85%, based on the weight of the composition, of a particulated metallic filler material selected from the group consisting of oxide coated copper, oxide coated copper alloys and mixtures thereof, and a curing agent for said resin selected from the group consisting of diethylene triamine, triethylene tetramine and diethylamino propyl amine in an amount of from about 50% to about 200% by weight in excess of that necessary to cure said resin to its solid infusible state.

2. A composition adapted to provide an electrically conductive resinous solid comprising an intimate admixture of an epoxy resin, up to about 85%, based on the weight of the composition, of a particulated metallic filler material selected from the group consisting of oxide coated copper, oxide coated copper alloys and mixtures thereof, a curing agent for said resin selected from the group consisting of diethylene triamine, triethylene tetramine and diethylamino propyl amine present in an amount of from about 12 to about 30 parts by weight of curing agent for each one hundred parts of resin.

3. A composition adapted to provide an electrically conductive resinous solid comprising an intimate admixture of an epoxy resin, up to about 85%, based on the weight of the composition, of a particulated metallic filler material selected from the group consisting of oxide coated copper, oxide coated copper alloys and mixtures thereof, and a curing agent for said resin selected from the group consisting of diethylene triamine, triethylene tetramine and diethylamino propyl amine in an amount of from about 20 to about 25 parts by weight of curing agent for each one hundred parts of resin.

4. A composition adapted to provide an electrically conductive resinous solid comprising an intimate admixture of (A) from about 15% to about 50%, by weight, of an epoxy resin and a curing agent for said resin selected from the group consisting of diethylene triamine, triethylene tetramine and diethylamino propyl amine, the weight proportion of the curing agent for each one hundred parts of resin being from about 12 to about 30 and (B) from about 50% to about 85%, by weight, of a particulated metallic filler material selected from the group consisting of oxide coated copper, oxide coated copper alloys and mixtures thereof.

5. A composition adapted to provide an electrically conductive resinous solid comprising an intimate admixture of an epoxy resin, a curing agent for said resin selected from the group consisting of diethylene triamine, triethylene tetramine and diethylamino propyl amine in an amount of from about 12 to about 30 parts by weight of curing agent for each one hundred parts of resin, up to about 85% of a particulated metallic filler material selected from the group consisting of oxide coated copper, oxide coated copper alloys and mixtures thereof, based on the weight of resin, curing agent and filler and an organic solvent to make admixture fluid.

6. A composition adapted to provide an electrically conductive resinous solid comprising an intimate admixture of an epoxy resin, a curing agent for said resin selected from the group consisting of diethylene triamine, triethylene tetramine and diethylamino propyl amine, said curing agent being present in an amount of from about 20 to about 25 parts by weight for each one hundred parts of resin, up to about 85% of a particulated metallic filler material selected from the group consisting of oxide coated copper, oxide coated copper alloys and mixtures thereof, based on the weight of resin, curing agent and filler and an organic solvent to make the admixture fluid.

7. A composition adapted to provide an electrically conductive resinous solid comprising an intimate admixture of (A) from about 15% to about 50%, by weight, of an epoxy resin derived from epichlorohydrin and para,para'-isopropylidenediphenol and a curing agent for said resin selected from the group consisting of diethylene triamine, triethylene tetramine and diethylamino propyl amine, the curing agent being present in an amount of from about 50% to about 200%, by weight, in excess of that necessary to cure said resin to its solid infusible state and (B) from about 50% to about 85%, by weight, of a particulated metallic filler material selected from the group consisting of oxide coated copper, oxide coated copper alloys and mixtures thereof.

8. A composition adapted to provide an electrically conductive resinous solid comprising an intimate admixture of (A) from about 15% to about 50%, by weight, of an epoxy resin derived from epichlorohydrin and para,para'-isopropylidenediphenol and a curing agent for said resin selected from the group consisting of diethylene triamine, triethylene tetramine and diethylamino propyl amine, the weight proportion of the curing agent for each 100 parts of resin being from about 12 to about 30 and (B) from about 50% to about 85%, by weight, of a particulated metallic filler material selected from the group consisting of oxide coated copper, oxide coated copper alloys and mixtures thereof.

9. An electrically conductive solid resinous composition comprising the reaction product of an epoxy resin, up to about 85%, based on the weight of the composition, of a particulated metallic filler material selected from the group consisting of oxide coated copper, oxide coated copper alloys and mixtures thereof and a curing agent for said resin selected from the group consisting of diethylene triamine, triethylene tetramine and diethylamino propyl amine and mixtures thereof, said curing agent being employed in an amount of from about 12 to about 30 parts by weight for each one hundred parts of resin.

10. An electrically conductive solid resinous composition comprising the solidified reaction product of an epoxy resin, up to about 85%, based on the weight of the composition, of a particulated metallic filler material selected from the group consisting of oxide coated copper, oxide coated copper alloys and mixtures thereof, a curing agent for said resin selected from the group consisting of diethylene triamine, triethylene tetramine and diethylamino propyl amine, said curing agent being employed in an amount of from about 20 to about 25 parts by weight for each one hundred parts of resin.

11. An electrically conductive solid resinous composition comprising the reaction product of an intimate admixture of (A) from about 15% to about 50%, by weight, of an epoxy resin and a curing agent selected from the group consisting of diethylene triamine, triethylene tetramine and diethylamino propyl amine, the curing agent being employed in an amount of from about 12 to about 30 parts by weight for each one hundred parts of resin and (B) from about 50% to about 85%, by weight, of an oxide coated particulated metallic filler material selected from the group consisting of copper, copper alloys and mixtures thereof and a finely divided inert filler, said inert filler being present in an amount up to about 25% of the total weight.

12. A transformer static plate comprising an insulating sheet material, an adherent electrically conductive resinous coating material deposited on the sheet, said coating material derived from an intimate admixture of an epoxy resin, a curing agent selected from the group consisting of diethylene triamine, triethylene tetramine and diethylamino propyl amine, said curing agent being employed in an amount of from about 12 to about 30 parts by weight for each one hundred parts of resin, up to about 85% of a particulated metallic filler material selected from the group consisting of oxide coated copper, oxide coated copper alloys and mixtures thereof, based on the weight of resin, curing agent and filler and an organic solvent to make said admixture fluid.

13. A transformer static plate comprising a first sheet of electrical insulating material, an adherent electrically conductive continuous film deposited on said sheet to form a uniform composite sheet, said continuous film derived from an intimate admixture of an epoxy resin, a curing agent selected from the group consisting of diethylene triamine, triethylene tetramine and diethylamino propyl amine, said curing agent being employed in an amount of from about 12 to about 30 parts by weight for each one hundred parts of said resin, up to about 85% of a particulated metallic filler material selected from the group consisting of oxide coated copper, oxide coated copper alloys and mixtures thereof, based on the weight of resin, curing agent and filler.

14. A transformer static plate comprising a first sheet of electrical insulating material, an adherent electrically conductive continuous film deposited on said sheet to form a uniform composite sheet, said continuous film derived from an intimate admixture of (A) from about 15% to about 50%, by weight, of an epoxy resin derived from epichlorohydrin and para,para'-isopropylidenediphenol and a curing agent selected from the group consisting of diethylene triamine, triethylene tetramine and diethylamino propyl amine, the curing agent being employed in an amount of from about 12 to about 30 parts by weight for each 100 parts of resin and (B) from about 50% to about 85%, by weight, of an oxide coated particulated metallic filler material selected from the group consisting of copper, copper alloys and mixtures thereof.

References Cited by the Examiner

UNITED STATES PATENTS

| | | | |
|---|---|---|---|
| 2,795,680 | 6/1957 | Peck | 252—511 |
| 2,825,702 | 3/1958 | Silversher | 252—511 |

OTHER REFERENCES

Chemical Trade Names and Commercial Synonyms, by William Haynes, Second Ed., D. Van Nostrand Co., Inc., Princeton, N.J., 1955, page 93.

The Condensed Chemical Dictionary, Sixth Ed., Reinhold Pub. Corp., N.Y., 1961, pages 444 and 445.

LEON D. ROSDOL, *Primary Examiner.*

JULIUS GREENWALD, *Examiner.*

R. D. EDMONDS, R. D. LOVERING, *Assistant Examiners.*